United States Patent

[11] 3,626,407

[72] Inventors Karsten E. Drangeid
Hedingen;
Andres Moser, Thalwil, both of Switzerland

[21] Appl. No. 58,438
[22] Filed July 27, 1970
[45] Patented Dec. 7, 1971
[73] Assignee International Business Machines Corporation
Armonk, N.Y.
[32] Priority Aug. 5, 1969
[33] Switzerland
[31] 11,852/69

[54] CIRCUITS FOR CONVERSION BETWEEN ANALOG AND DIGITAL REPRESENTATIONS OF DATA
9 Claims, 5 Drawing Figs.

[52] U.S. Cl. .......... 340/347 AD, 340/347 DA, 307/251
[51] Int. Cl. .......... H03z 13/175
[50] Field of Search .......... 340/347 AD, 347 DA; 307/238, 251

[56] References Cited

UNITED STATES PATENTS

| | | | |
|---|---|---|---|
| 3,234,544 | 2/1966 | Marenholtz .......... | 340/347 |
| 3,495,235 | 2/1970 | Ottesen .......... | 340/347 |
| 3,505,668 | 4/1970 | Ottesen .......... | 340/347 |
| 3,537,101 | 10/1970 | Campanella et al. .......... | 340/347 |
| 3,540,037 | 11/1970 | Ottesen .......... | 340/347 |

*Primary Examiner*—Thomas A. Robinson
*Attorneys*—Hanifin and Jancin and Bernard N. Wiener

ABSTRACT: An analog-to-digital converter is disclosed of the successive approximation type. The analog signal is converted to a current which is subtracted from the sum of weighted reference currents. Initially, all reference currents are switched on, but those not required for compensating the analog current are switched off in successive comparison steps. Illustratively, a thyristor-type switch is provided for each reference current source, and a common diode is provided as a path for the difference current. Through the novel combination of elements provided by this disclosure, these components are sufficient for the logic, comparison and switching functions required in the analog-to-digital conversion. A comparable digital-to-analog converter is also disclosed herein.

INVENTOR
KARSTEN E. DRANGEID
ANDRES MOSER

BY Bernard N. Wiener
ATTORNEY

CIRCUITS FOR CONVERSION BETWEEN ANALOG AND DIGITAL REPRESENTATIONS OF DATA

BACKGROUND OF THE INVENTION

Electronic analog-to-digital converters have been based on a number of different principles which can be categorized differently. A brief survey of known analog-to-digital converters in four main categories will now be presented.

There have been analog-to-digital converters in which a ramp or a staircase voltage is compared to the analog signal and in which the time necessary for the reference signal to increase from zero until coincidence is digitally measured. These converters include a reference voltage generator, a comparator, and a digital time measuring unit, e.g., clock and counter, and can be manufactured at relatively low cost. However, they have the disadvantage of being relatively inaccurate. Illustratively, in order to increase accuracy the reference signal generator should be carefully designed so that the signal amplitude changes exactly linearly over the time interval. Another disadvantage of this type of converter is that it is necessary for each conversion to run through all values from zero to the analog value presented so that operation is relatively slow.

A digital-to-analog converter with a feedback loop is involved in a second type of analog-to-digital converter. A given or randomly existing digital value is converted to an analog signal and this is compared to the analog signal to be converted. If there is a difference, the existing digital value is suitably altered by control circuitry, and the new digital value is again converted to an analog value until by stepwise approximation the correct digital value is obtained.

Generally, it has been easier to build a digital-to-analog converter than to build an analog-to-digital converter. In addition to a complete digital-to-analog converter, and a combined or separately arranged storage for the digital value, a comparator is also necessary. Further, a control circuit is required for changing a digital value according to the result of the comparator. However, by starting from zero and increasing the digital value stepwise until coincidence is reached, the time requirement is just as disadvantageous as it is for the converter with ramp reference signal.

Another type of analog-to-digital converter has a cascaded structure and generates the single digits for the digital representation stepwise one after the other. A separate switching circuit is provided having its own weighted reference signal for each digit to be generated. The values of the reference signals of neighboring stages have a ratio of 1:2, e.g., $\frac{1}{2}U_{max}$, $\frac{1}{4}U_{max}$, $\frac{1}{8}U_{max}$. In each stage, the applied analog signal, e.g., voltage, which is to be converted is compared to the respective reference signal. If the analog signal is greater, a bistable memory circuit is set to "1" in this stage, the reference voltage is subtracted from the analog voltage and the remaining signal is applied to the next stage for further processing. If the analog voltage is smaller than the reference signal, the memory circuit of this stage is set to "0" and the analog voltage is transferred unchanged to the next stage for further processing. Finally, the states of the binary memory circuits represent the value of the analog signal in coded form.

Converters of this type require for each stage a separate reference signal, and a binary memory circuit, a comparator and a subtracting circuit which must operate very accurately. If the same reference signal is used in all stages, the analog signals must be doubled for each transfer from one stage to the next. Therefore, additional amplifiers are required which must operate very accurately. The original analog signal is used only in the first stage and in all other stages a derived and possibly inaccurate signal is used.

During recent years, analog-to-digital converters have been suggested comprising a multistable network. In these converters, a number of switching elements with a region of negative resistance and two stable regions of high and low resistance are combined in a network with a plurality of possible stable states, i.e., there are $2^n$ states for $n$ switching elements. When an analog signal is applied to such a network it assumes one specific state which is representative of the analog signal usually after having passed several other states. The states of the individual switching elements represent a digital value in coded form.

It is necessary for such converters that the switching elements have different characteristics which are related to each other so that the different stable states of the network clearly distinguish from each other and that a unique association to the analog signal values is possible. For many of these circuits, because of the irreversibility of the setting process, the value which is already fixed for the higher value digits is not considered during the setting of the switching elements for the lower value digits. Illustratively, a case will result where at first the analog value decimal 8 = binary 1000 exists at the end of the conversion process. However, the analog value was decimal 7 = binary 0111 and the display will be finally binary 1111 = decimal 15 which is erroneous. The same situation occurs when the analog value is changed between the setting of the elements and readout of the converter. A separate sampling and holding device can be provided for the analog signal which requires additional circuitry and which is an additional source of malfunctions or errors.

SUMMARY OF THE INVENTION

It is an object of this invention to provide a method of and apparatus for analog-to-digital conversion with advantages over known converters.

It is another object of this invention to provide an analog-to-digital converter which is simple in design, and has relatively few components and permits simplifications and advantages in production.

It is another object of this invention to provide an analog-to-digital converter which does not require extra sampling circuitry for the analog signal for producing unambiguous digital values.

It is another object of this invention to provide a basic circuit design for an analog-to-digital converter which can be readily modified to be a digital-to-analog converter.

It is another object of this invention to provide a method of and apparatus for digital-to-analog conversion with advantages over known converters.

An advantage of an analog-to-digital converter of this invention is that it can be produced simply and inexpensively for integrated circuit technology.

Another advantage of this invention is that active components do not have to meet high standards with respect to tolerances of certain values of the characteristics. A further advantage of this invention results from the single digits of the digital value being produced sequentially at certain time instants, the digit with the highest value being available first. Because the digits are stored, they can be read out in parallel at any time instant.

Therefore, an analog-to-digital converter according to this invention is well suited for incorporation into devices which are produced in large numbers and which must have a low overall price. An example is the subscriber sets in telephone systems with pulse code modulation data transmission. Because of the low cost and the simplicity in production each such apparatus may comprise an analog-to-digital converter and a digital-to-analog converter built according to the principles of this invention so that the speech signals can be transferred digitally from and to the subscriber sets.

The invention provides a method of analog-to-digital conversion which is characterized by the addition of $n$ reference currents where $n$ is the number of digits in digital representation. The constant values of the reference currents are proportional to the position weights of the digital representation. A current proportional to the analog signal to be converted is subtracted from the sum of reference currents resulting in a difference current. Each reference current, starting with the largest, is compared sequentially to the difference current.

Thereafter, the respective reference current is switched off and the difference current is reduced by the same amount if the difference current is not smaller than the respective reference current. Finally, a difference current remains which is smaller than the constant value of the smallest reference current, and the sum of the reference currents left switched on is equivalent to the digital value for the applied analog signal.

For the practice of this invention, a comparison is obtained between a reference current and the difference current by steadily reducing the respective reference current, which assumes a constant value in quiescent condition. Consequently, the difference current is reduced by a control signal and which of these two currents first reaches effective zero value is observed. In those cases where the reference current is not switched off, the respective reference current and consequently the difference current assume their old values at the end of the control signal.

An analog-to-digital converter for the practice of this invention is characterized by $n$ parallel circuit branches each comprising a switching element, a reference current source, and a terminal for applying a control signal. Each switching element has a low resistance state and a high resistance state to which it can be brought by a reset signal or by decreasing the current below a minimum value. Each reference current source furnishes a current having a constant reference value when the corresponding switching element is in its low resistance state, but it can be forced by a control signal into an operating range where its current decreases steadily dependent on the control signal. The $n$ branches are connected to a common summing point. An analog signal current source is provided which is connected to the common summing point and furnishes a current proportional to an analog signal applied to its input. The common summing point is connected by a diode to a reference potential so that a current flows through it which if equal to the difference between the sum of the currents from the reference sources and the current from the analog signal current source.

The foregoing and other objects, features and advantages of the invention will be apparent from the following more particular description of preferred embodiments of the invention, as illustrated in the accompanying drawings.

DRAWINGS

FIG. 1 presents a schematic circuit diagram of an analog-to-digital converter according to this invention.

FIG. 2 presents a circuit diagram of a digital-to-analog converter according to this invention with structure related to that of the converter shown in FIG. 1.

FIG. 3 presents a line diagram showing the current-voltage characteristics of the switching elements and the reference current sources in the analog-to-digital converter presented in FIG. 1.

FIG. 4A and FIG. 4B present diagrams of the behavior of currents and voltages over the time when a control pulse is applied to one of the reference level current branches in the analog-to-digital converter of FIG. 1.

FIG. 1 illustrates an embodiment of the analog-to-digital converter of this invention by which four binary bits are generated for the digital representation of an input analog value. Since the output has the form of four-digit binary numbers, $d_1\, d_2\, d_3\, d_4$, 16 different analog levels can be distinguished by the embodiment of FIG. 1. There are four parallel circuit branches B1, B2, B3 and B4, one for each binary digit $d_1$, $d_2$, $d_3$ and $d_4$, respectively. Each circuit branch comprises a switching element $S_n$, a reference current source $C_n$ and a terminal $T_n$ for applying control signals. The switching elements $S_n$ are thyristors (four-layer diodes with control electrode, silicon controlled rectifiers). Each reference current source $C_n$ comprises a field effect transistor 13, a series-connected resistor 15 and a feedback loop 17 connected to the gate electrode 18 of the field effect transistor. Each terminal $T_n$ is connected through a resistor 19 to a common point 20 which in turn is connected to a voltage source having voltage $U_{00}$. The cathodes 22 of thyristors $S_n$ are connected to a common summing point Z and their control electrodes 24 are connected to a common reset input terminal 23.

An amplifier A is provided as the analog signal current source. It converts the input analog voltage $u_A$ into a proportional current $i_A=f(u_A)$. Illustratively, amplifier A includes a bipolar transistor 31 whose emitter is connected through resistor 33 to voltage source $-U_{00}$ and whose collector is connected to the common summing point Z. The input terminal 35 for the analog voltage $u_A$ to be converted to a digital representation is connected to the base of transistor 31. A bias voltage is established by resistor 37. Common summing point Z is also connected through semiconductor diode 41 to ground potential 42. Output terminal 43 is connected directly to the summing point Z and furnishes the digital output signals P1, P2, P3, and P4 of the analog-to-digital converter of FIG. 1.

Current sources $C_n$ furnish in their quiescent state currents with values having the same ratio to each other as the powers of 2. The smallest current is $I_0$ and corresponds to the smallest analog value which can be converted; it also corresponds to the increment. As is explained in greater detail below, this smallest current (the current increment) must be greater than the holding current $I_{HO}$ of the thyristors $S_n$, i.e., $I_0>I_{HO}$. The greatest current is equal to $(2^n-1)\cdot I_0$, which is $8I_0$ for the embodiment shown in FIG. 1. Thus, the sum of all constant currents of all branches is equal to $(2^n-1)\cdot I_0$, which is $15I_0$ for the embodiment shown in FIG. 1, and corresponds to the greatest analog value which can be converted thereby.

PRINCIPLES OF OPERATION OF EMBODIMENT OF FIG. 1

For an analog-to-digital conversion, all thyristors $S_n$ are switched on initially so that the reference current sources $B_1$, $B_2$, $B_3$, and $B_4$ furnish together the maximum current $(2^n-1)\cdot I_0$ to the common summing point Z. The analog voltage $u_A$ to be converted is transformed to a proportional current $i_a=f(u_A)$ by the amplifier A which acts as a current source. In most cases this current only partially compensates the constant currents flowing to summing point Z. Therefore, an additional compensating current (difference current) $i_D$ flows through diode D so that the sum of all currents at summing point Z is equal to zero.

A test to be described in detail hereinafter is then made for all reference current branches, starting with branch B1 of highest constant current, to determine whether the current $X\cdot I_0$ delivered by it is smaller than or equal to the difference current $i_D$. If this is the case, switch $S_n$ in the respective branch is changed to its nonconducting state so that constant current $X\cdot I_0$ is switched off and the difference current $i_D$ is reduced by the same amount. When the respective constant current $Z\cdot I_0$ is greater than the difference current $i_D$, the branch is left switched on and a pulse is furnished at summing point Z and consequently at the digital output terminal 43.

This operation is performed sequentially for all branches so that finally the difference current $i_D$ is equal to zero or is smaller than the current unit $I_0$. The sum of the constant currents $X\cdot I_0$ furnished by the reference current sources is then equal to the analog current $i_A$ to be converted and the states of all switches $S_n$ constitute a binary digital representation of the analog value to be converted. This digital information was also furnished during the conversion process as a sequence of pulses $P_1,\ldots P_4$ at output terminal 43.

CURRENT-VOLTAGE CHARACTERISTIC OF SWITCHES $S_n$ AND OF REFERENCE CURRENT SOURCES $C_n$

The characteristics of the switches $S_n$ and of the reference current sources $C_n$ will now be explained in connection with FIG. 3 where they are shown schematically in simplified form.

The characteristics of switches $S_n$, which is the same for each switch in the branches $B_1,\ldots B_4$, has a high-resistance part 50 and a low-resistance part 52 separated by a region of negative resistance 54. The switch $S_n$ remains in its high-resistance state until voltage $U_{BO}$ is reached. When voltage $U_{BO}$ is reached there is a voltage breakdown and the operating point jumps to the low-resistance part of the switch characteristic, i.e., the switch $S_n$ is switched on. As long as the current remains greater than the holding current $I_{HO}$, the switch $S_n$ is left switched on. However, if the current is reduced below the value $I_{HO}$, the operation point jumps back to the high-resistance part 50 of the characteristic. This is the usual behavior of a switching element having two stable states of different resistance, such as a thyristor and a tunnel diode.

For the sake of clarity, only the load characteristics of reference current sources $C_4$ and $C_3$ are shown in FIG. 3. For completeness, the curves for $C_2$ and $C_1$ would be added correspondingly starting at ordinate points $4I_0$ and $8I_0$. The current furnished by a current source $C_n$ is constant over a wide range. This is achieved in the embodiment by a field effect transistor with negative voltage feedback. If the feedback voltage is reduced below a certain value, the transistor will go into saturation. In this state of saturation, the current is dependent on the voltage which is shown by the branch of the $C_n$ characteristic leading downwards. In this range, the current is reduced if the voltage is reduced, i.e., the function $i=f(u)$ is monotonously increasing, which is an important property of the reference current sources. However, it is possible to use any component for this purpose which furnishes a constant current over a wide range but which can be brought by a control signal (a voltage pulse or a current pulse) into a range in which current and voltage are dependent on each other as described above.

The differences in the characteristics $C_n$, i.e., the value of the maximum (constant) current, can be determined solely by choosing the correct value of the feedback resistance. It is important that the smallest constant current, i.e., the current increment $I_0$, be greater than the holding current $I_{HO}$ of the thyristors $C_n$. In a quiescent state, current and voltage correspond either to point $Q_0$ if the corresponding thyristor $S_n$ is switched off (high-resistance state), or to point $Q_n$ if the thyristor $C_n$ is in its low-resistance state so that the maximum current $X \cdot I_0$ (where $X=1, 2, 4$ or $8$) flows in the respective circuit branch $B_1$, $B_2$, $B_3$ or $B_4$.

DETAILED DESCRIPTION OF THE ANALOG TO DIGITAL CONVERSION

A detailed explanation of an exemplary analog-to-digital conversion will now be given with reference to FIG. 1 and the curves shown in FIGS. 4A and 4B which are greatly simplified to show only schematically the essential relations therebetween. The analog voltage input at terminal 35 is a voltage $u_A$ which results in a current $u_A=9 \cdot I_0$. Therefore, the analog-to-digital conversion must result in the number 1001 (binary representation of 9).

Figure 4A:
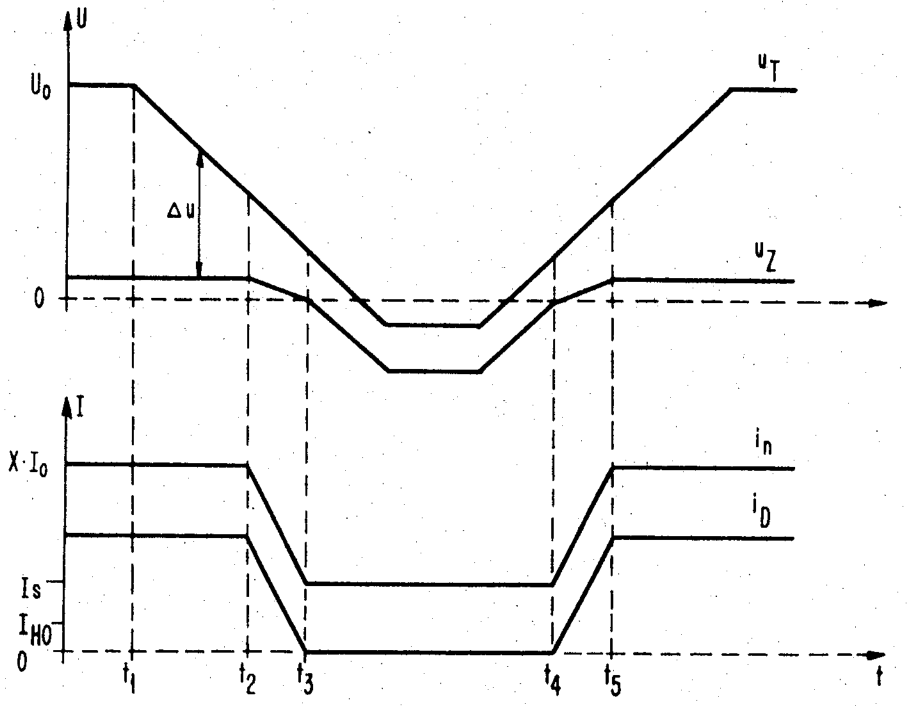
Figure 4B:
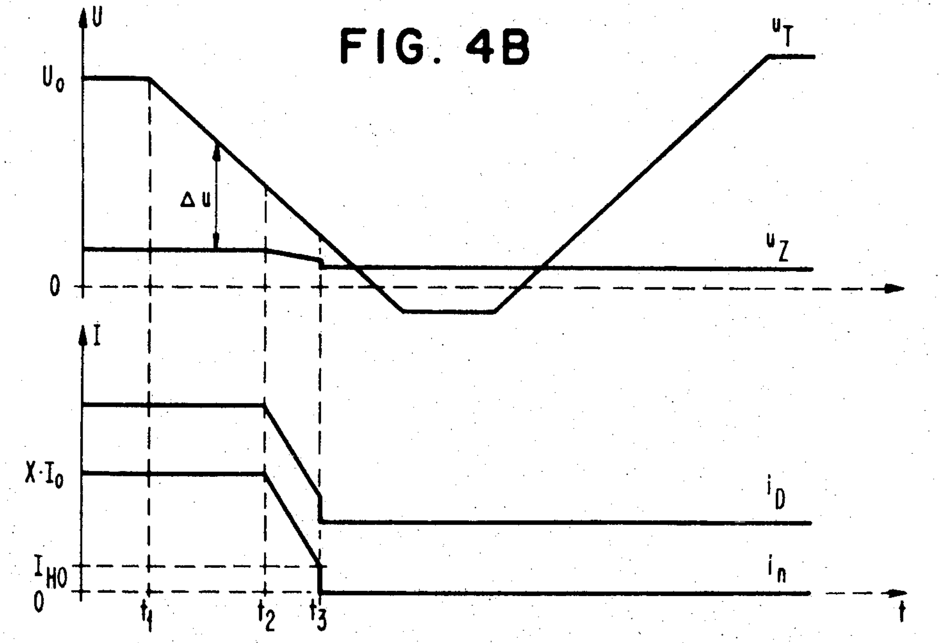

The conditions prior to time $t_1$ are shown in FIG. 4A and will be described first. A reset pulse RS is applied to the reset input terminal 23 which reaches the control electrodes 11 of all thyristors $S_n$ and switches them on and each circuit branch reference current source supplies the maximum current $X \cdot I_0$ ($X = 1, 2, 4$ or $8$). If two-terminal switching elements, not shown, without control electrode are used, a control pulse must be applied to each branch so that the voltage at each element $S_n$ reaches a value greater than the firing voltage $U_{BO}$. Accordingly, the sum of all constant currents, i.e., $15 \cdot I_0$, flows into the common summing point Z. The analog signal current source A takes a current $i_A=9 \cdot I_0$ so that a difference current $i_D=6 \cdot I_0$ flows through diode D. Voltage $u_z$ at the summing point Z is only slightly greater than zero (ground 42 potential). The voltage $u_T$ at terminal $T_1$ has a value $U_0$.

A control pulse ST then is applied to terminal $T_1$ which forces the voltage $u_T$ from a value $U_0$ to a value slightly below zero for a short time. This voltage is shown schematically in the upper part of FIG. 4A. Between times $t_1$ and $T_2$ the voltage difference $\Delta u$ between points $T_1$ and Z is reduced. However, the current is not yet reduced due to the feedback in the reference current source $C_1$. From time $t_2$ on, the voltage difference $\Delta u$ becomes so small that in the characteristic of the current source (current $i_n$) the bend is reached and the current decreases thereafter in the same way as the voltage. Therefore, between times $t_2$ and $t_3$ current $i_1$ in branch $B_1$ decreases steadily, and the difference current $i_D$ through diode is reduced by the same amount because all other currents remain constant.

At time $t_3$, the current $i_D=0$ and the voltage $u_z$ is approximately zero which results in closing of diode D. Thereafter, the voltage difference $\Delta u$ remains constant as does the current in branch $B_1$, i.e., $I_1=2 \cdot I_0$. Since the assumption was made that $I_O>I_{HO}$, the current will not decrease below the holding value and switch $S_1$ remains in its low-resistance (conducting) state. The voltage $u_z$ together with the trailing edge of the control pulse ST is again increasing and the diode D becomes conducting at time $t_4$. Thereafter the voltage difference $\Delta u$ increases and consequently the current in branch $B_1$ also increases, until its maximum value is reached at time $t_5$. At the end of the control pulse ST, there are again the same conditions as at the beginning. In the meantime, a pulse $P_1$ has been furnished at the digital output terminal 43 indicating this fact and thereby determining the value 1 for the highest binary digit.

Figure 3:
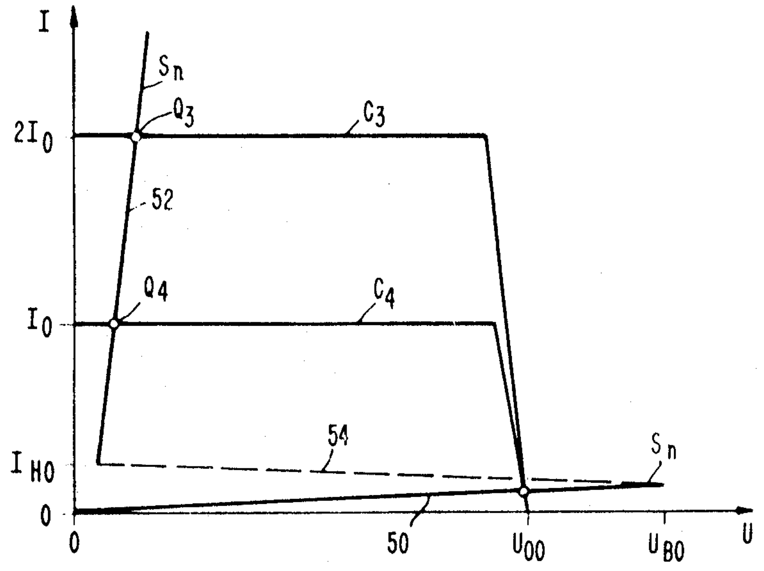

The conversion process for the second current branch $B_2$ for the second binary digit will now be presented. The maximum current $15 \cdot I_0$ is still flowing to the summing point Z. The difference current $i_D=6 \cdot I_0$ is still flowing through diode D because $i_A=9 \cdot I_0$. This condition can be seen in FIG. 4B in the part to the left of time line $t_1$. A control pulse ST is now applied to input terminal $T_2$. The voltage difference $\Delta u$ decreases between points $T_2$ and Z without any change in the currents until time $t_2$. When the bend in the characteristic of current source $C_2$ shown in FIG. 3 is reached at time $t_2$, the current $i_2$ in branch $B_2$ starts to decrease in the same way as the voltage difference $\Delta u$, and the difference current $i_D$ also decreases in the same way. Since this difference current is always greater than the remaining reference current by an amount of $2 \cdot I_0$, it does not reach the value zero. At the beginning the conditions were $i_D=6 \cdot I_0$, $i_2=4 \cdot I_0$. Consequently, diode D remains conducting, the voltage $u_T$ remains slightly greater than 0, and the voltage difference $\Delta u$ becomes so small that a time $t_3$ the remaining reference current of $C_2$ decreases below the holding current value $I_{HO}$. At this moment, thyristor $S_2$ is extinguished, i.e., it is transferred to the high-resistance state. The current in branch $B_2$ now becomes zero, and the difference current assumes a constant value $i_D=2 \cdot I_0$.

When voltage $u_T$ at terminal $T_2$ increases because of the trailing edge of the control pulse ST, no change occurs in the current value in current branch $B_2$ because switch $S_2$ remains in its high-resistance state, i.e., at the end of the control pulse the current through branch $B_2$ is approximately zero. During this step of the conversion process no output pulse was generated at the digital output so that the second binary digit is determined as being zero. At most a small noise pulse $P_2$ would be generated.

The next two conversion steps for branches $B_3$ and $B_4$ for the two lower binary digits are performed in a similar manner. In the third step the constant current $2 \cdot I_0$ of the third branch is interrupted by switching off switch $S_3$ and the difference current $i_D$ becomes practically zero. As no output pulse is generated, digit $P_3$ is equal to 0.

Finally, in the fourth step, there is no switching of the constant current $I_0$ since it is greater than the difference current $i_D$ as in the first step. An output pulse $P_4$ is generated this time indicating that the fourth binary digit equals 1. At the end of the entire analog-to-digital conversion the switching states of the four switching elements $S_1$ through $S_4$ reflect the digital representation of the analog voltage value applied to the input terminal 35. The binary number 1001 is also available in stored form and may be extracted in parallel from the terminals $T_1$ through $T_4$ or through extra terminals between switching elements $S_n$ and reference sources $C_n$, not shown, e.g., at the feedback branches 17. During the conversion the four digits of the binary number 1001 were furnished in the form of sequential pulses $P_1$, $P_2$, $P_3$ and $P_4$ at the digital output terminal 43 of FIG. 1.

REQUIREMENTS FOR THE COMPONENTS OF ANALOG-TO-DIGITAL CONVERTER

The active components which are used in multiple and in parallel, i.e., thyristors $S_n$ and field effect transistor 13 of the reference current sources $C_n$, may be equal to each other. For the production of integrated circuits, this is a very favorable condition and is a considerable advantage over known analog-to-digital converters in which the components having negative resistance regions must have different characteristics which have to be matched to each other very accurately. Matching the parallel reference current sources can be effected with resistances because it is necessary to fix only the maximum currents to the values $I_0$, $2I_0$, $4I_0$, etc. This matching of ohmic resistances can be achieved simply in integrated circuits. It is possible to use other codes, e.g., applying the coefficients 4–2–a'–1 instead of 8–4–2–1 for the constant current. However, there are only 10 different signal levels which can then be distinguished. The exemplary code shown by which binary numbers are generated is apparently the most advantageous for most applications.

MODIFICATIONS OF THE ANALOG-TO-DIGITAL CONVERTER

Instead of the thyristors (four-layer diodes with control electrode, silicon controlled rectifiers) which are used in the embodiment illustrated in FIG. 1 as switching elements $S_n$, other components may be used which similarly switch between a high-resistance state and a low-resistance state and which switch back when the current falls below a holding current value. Illustratively, pairs of complementary transistors may be used in which the base of one transistor is connected to the collector of the other transistor, and vice versa. By using additional resistors the value of the holding current $I_{HO}$ may be determined. Further, the active components in the reference current sources shown as field effect transistors in the embodiment of FIG. 1 may be bipolar transistors or other similar elements.

Instead of connecting each terminal point $T_n$ through a resistor 19 with a common voltage source $U_{00}$, the power supply and the coupling-in of the control pulses may be accomplished so that each point $T_n$ is connected separately to a related signal source, e.g., a transistor, which furnishes the voltage $+U_{00}$ in the quiescent state and which changes from quiescent voltage to a voltage value slightly below zero for a short time according to a desired pulse program. Further, the analog signal current source A may comprise another component instead of the bipolar transistor 31.

A modification of the conversion range, or scale of the analog-to-digital converter of this invention, is possible simply by changing the resistors 33 or 37, i.e., by changing the feedback or the bias of the analog signal current source. Illustratively, a number of parallel resistances may be provided among which a selection can be made by switches or by plug-in connections.

DIGITAL-TO-ANALOG CONVERTER EMBODIMENT

The basic structure of the analog-to-digital converter described hereinbefore is used for the digital-to-analog converter embodiment of this invention which will be described with reference to FIG. 2. The parts which appear in FIG. 1 and also in FIG. 2 have the same reference numbers. A prime mark is added to the identification number in FIG. 2 if multiple parts of FIG. 1 are combined as one common part in FIG. 2 or if one common part is split into a multiplicity of parts. Some parts of FIG. 1 are not used for the digital-to-analog converter embodiment of this invention shown in FIG. 2. In FIG. 2 portions of the reference current branches comprising switching elements $S_n$ and reference current sources $C_n$ are the same as in the analog-to-digital converter of FIG. 1 and are identified as $B_1$, $B_2'$, $B_3'$, and $B_4'$. One end of each of these circuit branches is connected to the common summing point Z and the other end of each circuit is also connected to a common input terminal I' (21') which is also connected through a resistor 19' to the voltage source $+U_{00}$. The control electrodes 22–1, 22–2, 22–3 and 22–4 of switching elements $S_n$ are connected, respectively, to input terminals 23'–1, 23'–2, 23'–3 and 23'–4. The analog amplifier A and the diode D of the analog-to-digital converter of FIG. 1 are not used for the digital-to-analog converter of FIG. 2. Further, the summing point Z is connected through an ohmic resistor R to ground potential 42. The terminal 43' connected to summing point Z is the output terminal.

Prior to the digital-to-analog conversion, the thyristors $S_n$ are switched off by a reset pulse RS' applied to input terminal T' (21'). Thereafter, digital signals $P_1$,... $P_4$ are applied to input terminals 23'–1,... 23'–4, respectively, either in parallel or sequentially so that some of the thyristors $S_n$ are switched on according to the applied pulses. Finally, the constant currents according to the binary digits applied to the input are added in summing point Z so that the voltage drop at resistor R is provided as the analog signal at the output terminal 43'.

In practice, a converter which is built according to the principles of this invention may be switched as required from an analog-to-digital converter embodiment to a digital-to-analog converter embodiment, and vice versa. In a manner not shown, a resistor R and suitable terminals and lines are provided in addition to the components shown in FIG. 1. Changeover between the two converter types is then readily effected by manual switches or by plug-in connections. Further, identical basic building blocks which contain all possible components for the two types of converters provided by this invention may be produced during the manufacturing procedures or a conductor pattern may be provided which contains all of the required connections, and any connections which are not required for an embodiment of this invention as illustrated in FIG. 1 or FIG. 2 can be eliminated by interrupting them, e.g., by etching, or the required connections may be established by soldering in additional wires.

SUMMARY

The operation of an analog-to-digital converter according to the principles of the invention, will now be summarized. The analog current to be converted is subtracted from the sum of a number of reference currents having weighted constant values and a difference current (compensating current) is generated (function of summing point Z and diode D of FIG. 1). Each reference current is sequentially compared to the difference current by reducing both of them in the same way and a determination is made which of the two currents first becomes zero (function of the reference current source $C_n$ when a control pulse ST is applied, of the switching element $S_n$ and of the diode D). Thereafter both currents resume their initial value if the constant value of the corresponding reference current is greater. However, the reference current is interrupted and the difference current is reduced by the same value if the difference current is greater (function of the switching element $S_n$ and diode D). Finally, the sum of the constant currents still flowing from the reference current sources is equal to the analog current to be converted except for a negligible difference.

Figure 1:
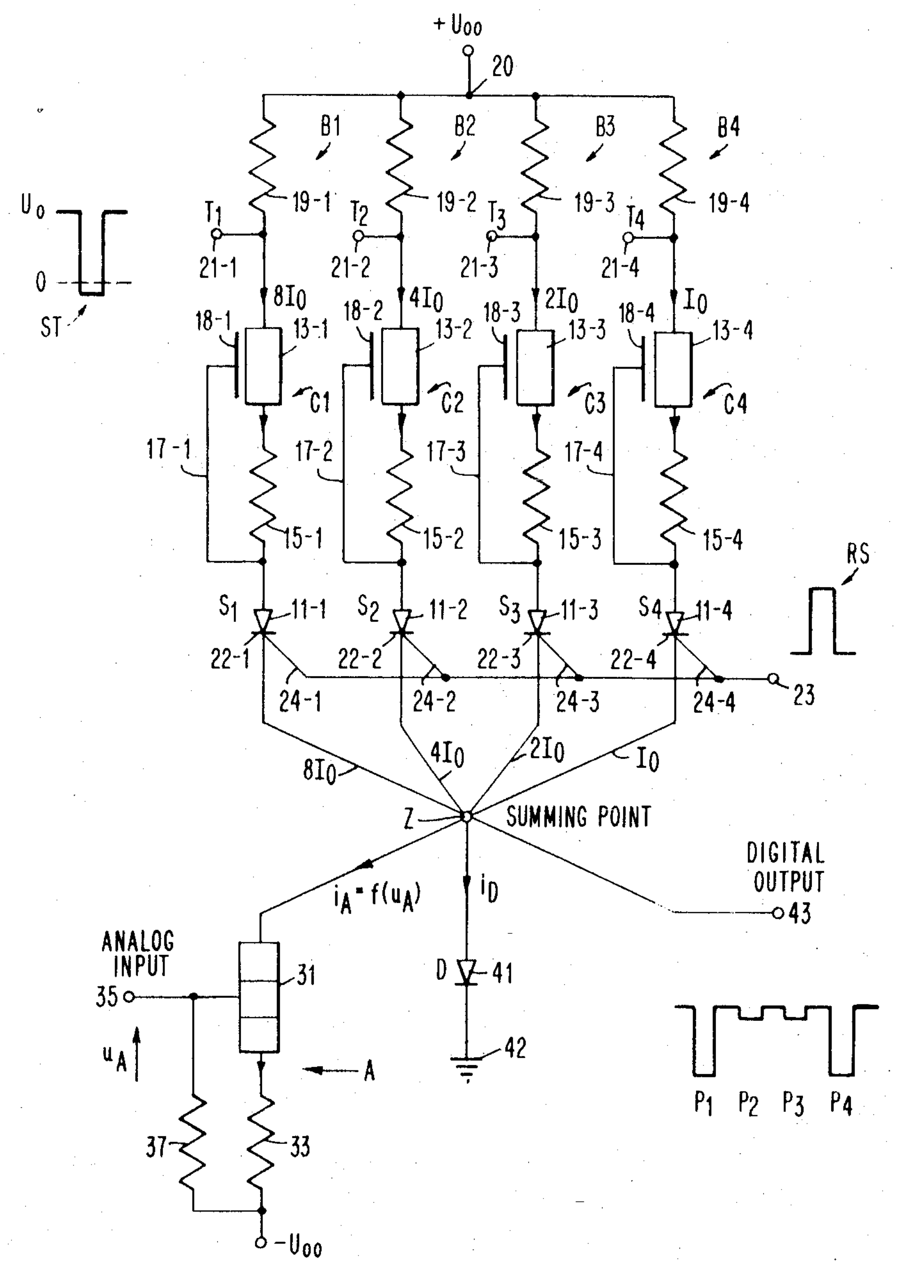
Figure 2:
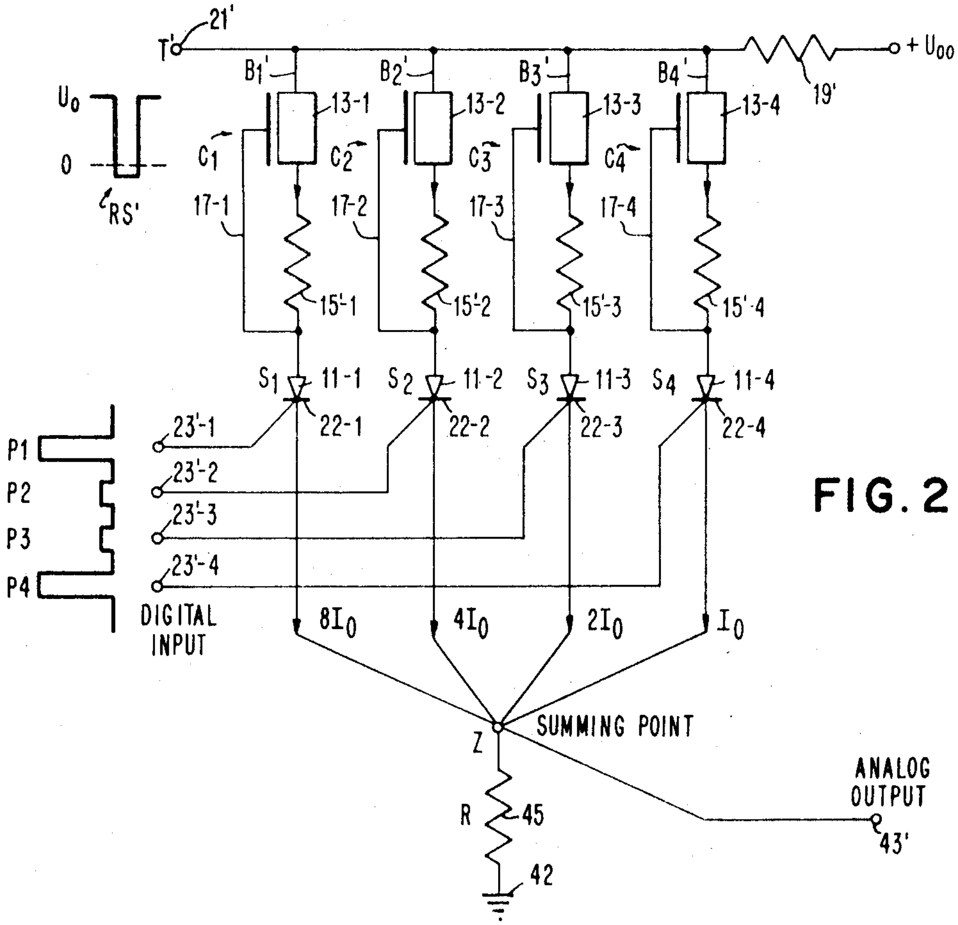

With reference to FIG. 1, diode D performs a number of important functions. It enables the difference current $i_D$ (compensating current) to flow, which represents the difference between the weighted constant reference currents and the analog current to be converted; it enables the determination of when the difference current becomes equal to 0; and it enables the remaining reference currents to flow and thereby the holding of the switching element $S_n$ in its conducting state if the difference current has become equal to 0. Each switching element $S_n$ enables detection of when the reference current in the corresponding branch has approached 0 value and then effects a permanent switching off of the corresponding reference current. Further, it stores the binary number determined by this branch.

Because the comparing and switching functions are distributed over several components, and because some of the components provide a plurality of partial functions, an analog-to-digital converter according to this invention is possible which requires a minimum of components. The circuitry comprises only transistors, diodes and resistors, and the characteristics of the transistors do not have to meet high standards because matching of components can be accomplished by resistors. This is advantageous for mass production in integrated circuit technology.

The digital signals may be provided sequentially at certain time instants which can be externally determined. However, they may also be extracted in parallel from storage. With an appropriately high clock frequency, the analog signal need not be sampled and intermediate storage is not necessary because the sampling is partially achieved by the control pulses. In all stages of the analog-to-digital converter, a comparison is made with the original analog signal which has not been changed by subtraction, duplication or a similar process. The first (highest) digit of the digital value is always determined first and can be further processed before the conversion process is finished. When the last (lower) digits are generated, the result which has been determined is being utilized so that variations in the signal do not result in large errors. Once a digit of the digital value has been determined, it remains unchanged and is not altered during readout.

The same basic structure may be used both for an analog-to-digital converter of this invention and for a digital-to-analog converter. Further, the converter described herein is suitable for systems with digital transmission of analog data in pulse code modulation and may be incorporated in telephone subscriber sets in such systems.

We claim:

1. Analog-to-digital converter for producing a digital representation of an analog signal which comprises:
   means for providing *n* reference currents, where *n* is the number of digits of said digital representations, said reference currents having respective constant values which are proportional to the position weights of said digital representations;
   means for adding said *n* reference currents;
   means for subtracting a current proportional to the value of said analog signal from said sum of said reference currents to provide a difference current;
   means for comparing each said reference current sequentially, starting with the largest, with said difference current, and
   means for terminating each said sequential comparison reference current and for reducing said difference current by the value of said comparison reference current if said difference current is equal to or greater than said comparison reference current;
   whereby a difference current remains which is smaller than the constant value of the smaller one of said reference currents, said remaining sum of said reference currents which are left switched on being equivalent to the digital value of said applied analog signal.

2. Analog to digital converter as set forth in claim 1 wherein:
   said means for comparing each said sequential reference current and said difference current includes
   means for reducing said sequential reference current, for reducing said difference current and for determining which one thereof first reaches zero value, and
   means for resuming the values of said respective sequential reference current and said difference current which were maintained before the initiation of the respective sequential comparison when said respective reference current is not switched off.

3. Analog-to-digital converter for producing a digital representation of an analog signal which comprises:
   *n* current branches, each said current branch including
   a respective switching element, said respective switching element having a low-resistance state and a high-resistance state to which it can be brought by applying a reset signal or by decreasing the current below a minimum value,
   a respective terminal for receiving a control signal,
   a respective reference current source, each said reference current source furnishing a reference current having a constant reference value when said respective switching element is in its low-resistance state and having a steadily decreasing value when forced into a given operating range by said control signal with the steadily decreasing value being dependent on said control signal;
   means for connecting said *n* current branches to a common summing point,
   analog current source means for applying to said summing point an analog current which is proportional to said applied analog signal; and
   unilateral impedance means for connecting said common summing point to a reference potential for carrying a current equal to the difference between the sum of the currents from said reference sources and said current from said analog current source.

4. Analog-to-digital converter according to claim 3, wherein:
   said reference current sources each include
   a transistor with a series connected negative feedback resistor, said transistor having a control electrode, and
   a feedback loop connected to the control electrode of said transistor.

5. Analog-to-digital converter according to claim 4, wherein:
   said transistors in all said reference current sources have approximately the same characteristics;
   said switching elements in all said current branches have approximately the same characteristics; and
   said different constant values of said reference current sources are determined by different values of respective negative feedback resistors.

6. Analog-to-digital converter according to claim 3, wherein:
   said switching elements are four-layer diodes with respective control electrodes, and
   said control electrodes are connected to a common reset signal input terminal.

7. Analog-to-digital converter according to claim 3 arranged in such a way that said analog-to-digital converter can selectively be changed to function as a digital-to-analog converter wherein:
   said switching elements include respective control electrodes which can be selectively connected to a common terminal or each to a separate terminal;
   said control signal terminals can be selectively connected to a common control signal terminal;
   said analog current source and said unilateral impedance can be selectively disconnected from said common summing point; and
   a resistor is provided of which one end is connected to said reference potential and the other end of which can be selectively connected to said common summing point in place of said unilateral impedance.

8. Method of analog-to-digital conversion of an analog signal to a digital representation comprising the steps of:
   providing *n* reference currents, where *n* is the number of digits of said digital representation, said reference currents having respective constant values which are proportional to the position weights of said digital representation;
   adding said *n* reference currents;

subtracting a current proportional to the value of said analog signal from said sum of said reference currents to provide a difference current;

comparing each said reference current sequentially, starting with the largest, with said difference current; and terminating each said sequential comparison reference current and reducing said difference current by the value of said comparison reference current if said difference current is equal to or greater than said comparison reference current;

whereby a difference current remains which is smaller than the constant value of the smaller one of said reference currents, said remaining sum of said reference currents which are left switched on being equivalent to the digital value of said applied analog signal.

9. Method as set forth in claim 8 wherein:

said comparing said sequential reference current and said difference current includes steadily reducing said sequential reference current by a control signal to a constant quiescent value for reducing said difference current and determining which one thereof first reaches zero value, and resuming the values of said respective sequential reference current and said difference current which were maintained before the initiation of the respective sequential comparison when the said reference current is not switched off.

* * * * *